US010101176B2

(12) United States Patent
Mohamad Yazid et al.

(10) Patent No.: US 10,101,176 B2
(45) Date of Patent: Oct. 16, 2018

(54) CARRIER TAPE PACKAGING METHOD AND APPARATUS

(71) Applicant: Texas Instruments Incorporated, Dallas, TX (US)

(72) Inventors: Sahaimi Mohamad Yazid, Selangor (MY); Wan Mohd Azam Wan Yusoff, Kuala Lumpur (MY); Noor Azlan Zainal Abidin, Selangor (MY)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 1014 days.

(21) Appl. No.: 14/209,769

(22) Filed: Mar. 13, 2014

(65) Prior Publication Data
US 2015/0262852 A1 Sep. 17, 2015

(51) Int. Cl.
B65G 43/00 (2006.01)
B65G 47/00 (2006.01)
B65G 47/02 (2006.01)
G01D 5/14 (2006.01)
H01L 21/683 (2006.01)
H05K 13/02 (2006.01)

(52) U.S. Cl.
CPC ............ *G01D 5/14* (2013.01); *H01L 21/6835* (2013.01); *H05K 13/022* (2013.01); *H01L 2221/68313* (2013.01); *Y10T 29/49002* (2015.01)

(58) Field of Classification Search
None
See application file for complete search history.

(56) References Cited

U.S. PATENT DOCUMENTS

| | | | | |
|---|---|---|---|---|
| 2,838,161 A | * | 6/1958 | Page | A01K 43/00 198/433 |
| 3,777,885 A | | 12/1973 | Bartek | |
| 4,327,482 A | * | 5/1982 | Araki | H05K 13/0408 228/6.2 |
| 4,470,507 A | | 9/1984 | Burns | |
| 4,686,468 A | | 8/1987 | Lee et al. | |
| 4,708,245 A | | 11/1987 | Boeckmann et al. | |
| 4,736,841 A | | 4/1988 | Kaneko et al. | |
| 4,808,809 A | * | 2/1989 | Hayakawa | G01V 8/12 250/205 |
| 4,844,258 A | | 7/1989 | Boeckmann et al. | |
| 4,884,696 A | * | 12/1989 | Peleg | B07C 5/00 198/408 |
| 5,076,427 A | | 12/1991 | Thomson et al. | |
| 5,115,911 A | | 5/1992 | Schulte et al. | |
| 5,131,535 A | | 7/1992 | O'Connor et al. | |
| 5,234,104 A | | 8/1993 | Schulte et al. | |
| 5,263,583 A | | 11/1993 | Ohashi | |
| 5,373,938 A | | 12/1994 | Kubo | |

(Continued)

OTHER PUBLICATIONS

Wafer Level Chip Size Package, NXP Semiconductors, AN10439, Rev. 03, Oct. 17, 2007, 14 pp.

*Primary Examiner* — Kavel Singh
(74) *Attorney, Agent, or Firm* — Dawn Jos; Charles A. Brill; Frank D. Cimino

(57) ABSTRACT

An apparatus for detecting misplaced units in a moving carrier tape having a plurality of pockets with units positioned therein. The apparatus includes a displaceable assembly having a head portion positioned above the carrier tape that is adapted to deflect in response to engagement with a misplaced unit in one of the plurality of pockets.

6 Claims, 3 Drawing Sheets

(56) References Cited

U.S. PATENT DOCUMENTS

| | | |
|---|---|---|
| 5,375,710 A | 12/1994 | Hayakawa et al. |
| 5,472,085 A | 12/1995 | Gelzer |
| 5,499,717 A | 3/1996 | Hayashi |
| 5,673,795 A | 10/1997 | Clatanoff et al. |
| 5,690,233 A | 11/1997 | Kaneko |
| 5,731,230 A | 3/1998 | Nevill et al. |
| 6,016,917 A | 1/2000 | Haggard et al. |
| 6,047,832 A | 4/2000 | Raschke |
| 6,105,783 A | 8/2000 | Sato |
| 6,109,445 A | 8/2000 | Beyer |
| 6,216,419 B1 | 4/2001 | Sakurai |
| 6,370,447 B1 * | 4/2002 | Miyazaki ............... B65G 43/10 198/349.8 |
| 6,540,086 B1 | 4/2003 | White, Jr. |
| 6,708,816 B2 * | 3/2004 | Schindler .......... H01L 21/67706 198/803.14 |
| 6,860,391 B2 | 3/2005 | Kawada |
| 6,949,158 B2 | 9/2005 | Ball et al. |
| 7,040,171 B2 * | 5/2006 | McGee .................... H02K 7/06 438/106 |
| 7,611,016 B2 | 11/2009 | Wihren |
| 8,033,397 B2 | 10/2011 | Sasamura et al. |
| 8,353,424 B2 | 1/2013 | Ikeda et al. |
| 2001/0040117 A1 | 11/2001 | Easton |
| 2003/0019784 A1 | 1/2003 | Pylant |
| 2003/0049437 A1 | 3/2003 | Devaney et al. |
| 2006/0157382 A1 | 7/2006 | Yasufuku et al. |
| 2007/0062845 A1 | 3/2007 | Velasquez Urey et al. |
| 2008/0000804 A1 | 1/2008 | Carey et al. |
| 2015/0083641 A1 | 3/2015 | Wyant |

* cited by examiner

CARRIER TAPE PACKAGING METHOD AND APPARATUS

BACKGROUND

In general, carrier tapes that are used to transport components from a component manufacturer to a different manufacturer that assembles the components into new products are well known. For example, in the field of electronic circuit assembly, electronic components are often carried from a supply of such components to a specific location on a circuit board for attachment thereto. The components may be of several different types, including surface mount components. Particular examples include memory chips, integrated circuit chips, resistors, connectors, dual in-line processors, capacitors, gate arrays, etc. Such components are typically affixed to a circuit board that may later be incorporated into an electronic device.

Rather than manually affixing each individual electronic component to a circuit board, the electronics industry makes extensive use of robotic placement machines, sometimes known as "pick-and-place" machines, which grasp a component at a specific location (the supply) and place it at another specific location (the circuit board). To ensure the sustained operation of the robotic placement machine, a continuous supply of electronic components must be furnished to the machine at a predetermined rate and location to permit the machine to be programmed to repeat a precise sequence of movements during every cycle. It is therefore important that each such component be located in the same position (i.e. the point at which the robotic placement machine grasps the component) as each preceding and succeeding component.

One way to provide a continuous supply of electronic components to a desired location is to use a carrier tape. Conventional carrier tapes generally comprise an elongated strip that has a series of identical pockets formed at predetermined, uniformly spaced intervals along the length of the tape. The pockets are designed to receive an electronic component. The electronic component is typically placed in the pocket by a robotic device known as a pick-and-place machine. Downstream of the point where the electronic components are loaded into the pockets of the carrier tape, a continuous cover tape is applied over the elongated strip to retain the components in the pockets. The tapes also normally include a series of through holes uniformly spaced along one or both edges of the elongated strip. The through holes receive the teeth of a drive sprocket that advances the tape toward the robotic placement machine.

Eventually, the carrier tape is fed to another robotic placement machine that strips the continuous cover tape from the carrier and removes the components from the pockets and places them onto the circuit board.

DETAILED DESCRIPTION

Figure 4:
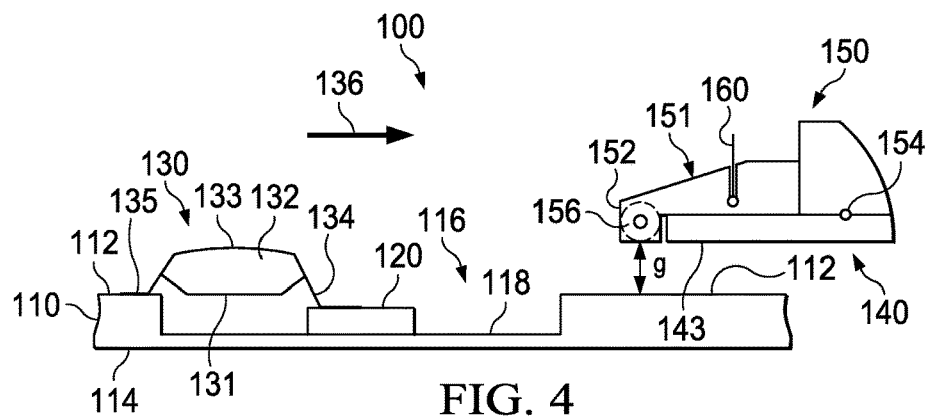
FIG. 4 is a partially cross-sectional elevation view of a carrier tape with a misplaced unit in a pocket positioned upstream of a detection assembly.
Figure 5:
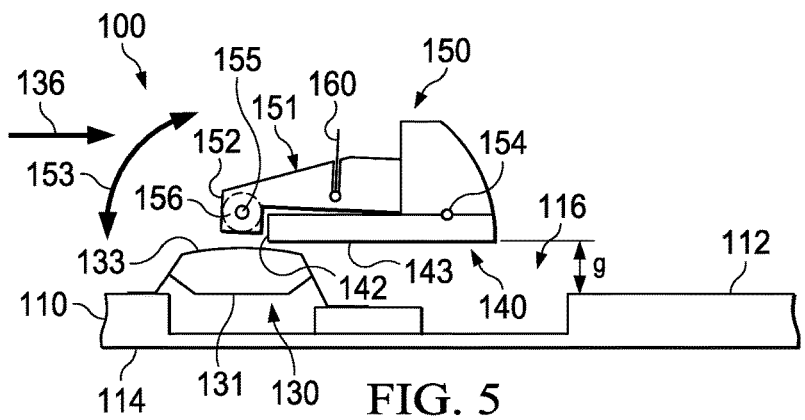
FIG. 5 is the same view as FIG. 4 except that the carrier tape has advanced and the misplaced unit has caused a head portion of the detection assembly to deflect upwardly.
Figure 6:
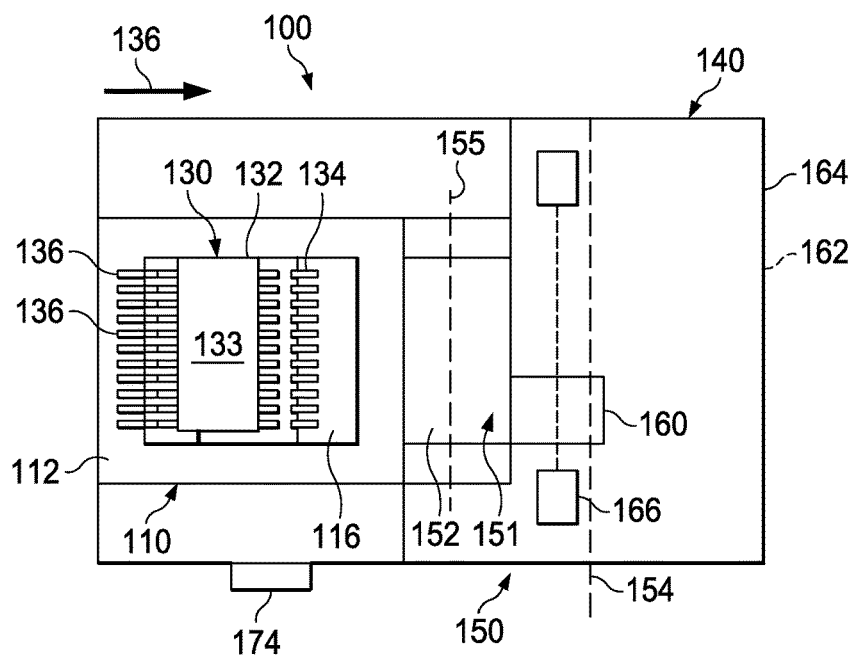
FIG. 6 is a top plan view of the carrier tape, misplaced unit, and detection assembly of FIG. 4.

This specification, in general, discloses an apparatus 100, FIGS. 4-6, for detecting misplaced units 130 in a moving carrier tape 110 having a plurality of pockets 116 with units 130 positioned therein. The apparatus 100 includes a detection assembly 150 having deflectable member with a head portion 152 positioned at a predetermined height above the carrier tape 110. The deflectable member is adapted to deflect in response to engagement with a misplaced unit 130 in one of the plurality of pockets 116. Having thus described an apparatus for detecting misplaced units generally, further details and different embodiments thereof and methods of operation will be described below.

Figure 1:
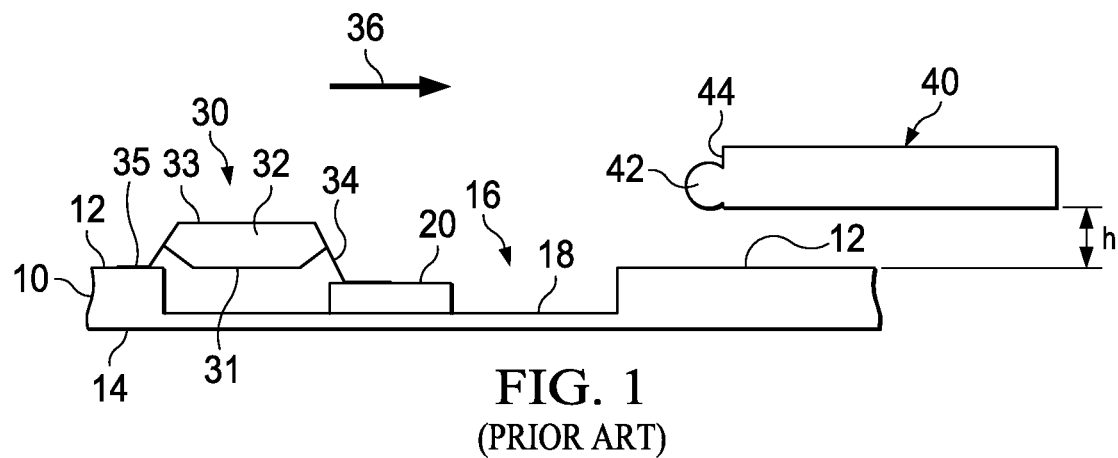
FIG. 1 is a cross-sectional elevation view of a carrier tape with a misplaced unit in a pocket positioned upstream of a prior art sensor and cover assembly.

FIG. 1 is a cross-sectional elevation view showing operation of a prior art sensor 42. The carrier tape 10 has a top surface 12 and a bottom surface 14. Pockets 16 extend downwardly from the top surface 12 ending in a pocket bottom surface 18. Pocket bottom surface 18 may include a small pedestal structure 20 for supporting units 30, such as electronic components, in a predetermined orientation. The carrier tape 10 is displaced at a substantially constant speed in direction 36, which defines a downstream direction. Units 30 comprise a body portion 32 having a bottom surface 31 and top surface 33. Front leads 34 and back leads 35 extend outwardly from the body portion 32. The unit 30 shown in FIG. 1 is misplaced, i.e., placed improperly. In a proper placement, the bottom surface 31 of the body portion 32 would rest on top the pedestal structure 20 and front and back leads 34, 35 would rest on pocket bottom surface 18. In the orientation of the unit 30 in FIG. 1, the front leads 34 rest on the pedestal structure 20 and the back leads 35 rest on the top surface 12 of the tape 10, causing the top surface 33 of the body portion 32 to be significantly elevated with respect to its proper position. Slightly downstream from the pocket 16 in FIG. 1 is a track cover 40. The cover 40, in this position, is at a height "h" at least 0.1 mm above the top surface 12 of the carrier tape 10. The reason that the high is at least 0.1 mm is to provide a sufficient clearance space between the tape and the fixed cover to prevent damaging the tape in the event of minor changes in the clearance space due to temperature changes, etc. A cross-beam sensor assembly 42 is mounted on a front edge portion 44 of cover 40. This sensor assembly 42 typically includes a photo diode positioned to one side of the tape path and photosensor positioned to the other side. Ordinarily the top surface 33 of a unit 30, if in an elevated position, will break the light beam produced by the photo diode, causing the photosensor signal to change, thus indicating the presence of a misplaced unit 30.

Figure 2:
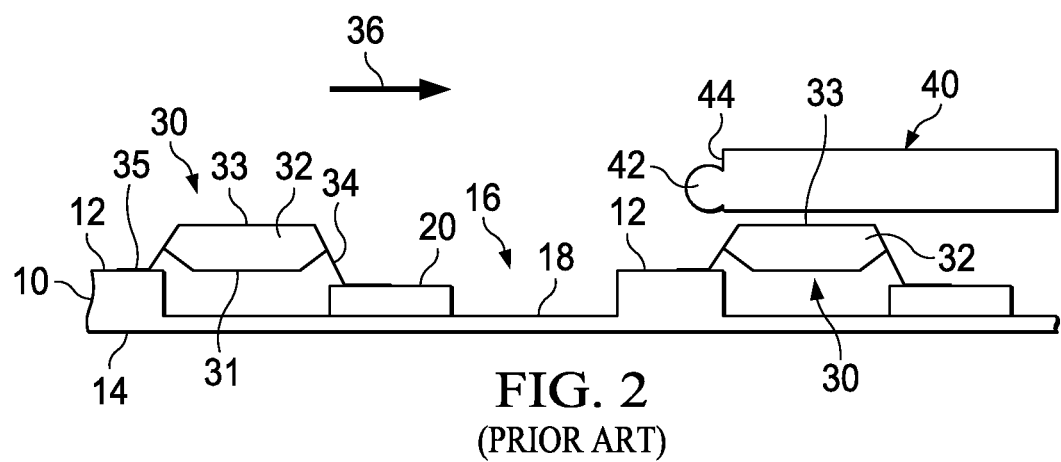
FIG. 2 is a cross-sectional view of a carrier tape as in FIG. 1, wherein misplaced units are sufficiently thin to avoid detection by the prior art sensor.

FIG. 2 illustrates one problem with the prior art assembly shown in FIG. 1. The assembly shown in FIG. 2 is the same assembly as shown in FIG. 1, except that the carrier tape is carrying two units 30 that are relatively thin. Because of their reduced height, these units 30 do not break the light beam of the sensor assembly 42, even though the two units 30 are misplaced. Thus, in the assembly of FIG. 2, two undetected misplaced units 30 will be covered with cover tape at a downstream location. A carrier tape roll (not shown) that includes these two misplaced units will thus be shipped to a printed circuit board assembly facility and will likely cause problems at the facility when a pick-and-place machine (not shown) attempts to engage these misplaced units 30 to mount them on a printed circuit board (not shown).

Figure 3:
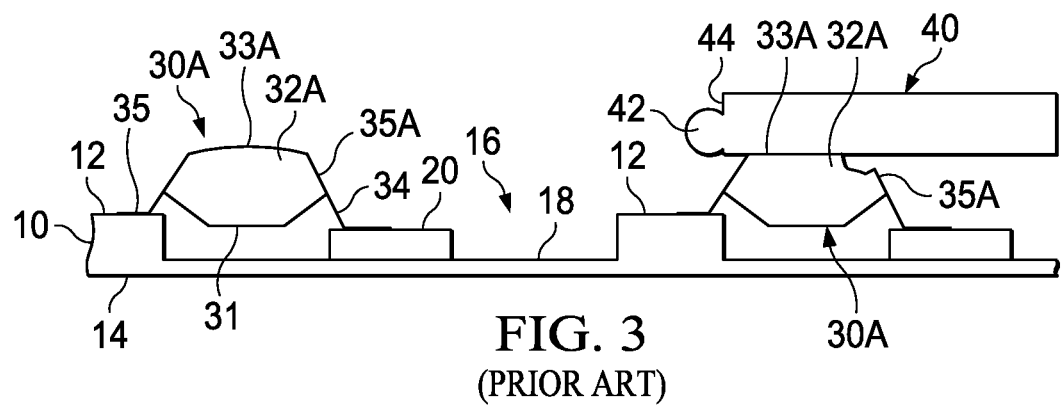
FIG. 3 is a cross-sectional view of a carrier tape as in FIGS. 1 and 2 wherein misplaced units are sufficiently thick to be damaged by the cover if the prior art sensor does not detect them and stop advancement of the carrier tape.

FIG. 3 illustrates another problem with prior art assemblies such as shown in FIG. 1. In the assembly of FIG. 3, the units 30A are relatively thick units. The sensor assembly 42 shown in FIG. 3 has, for some reason, malfunctioned. As a result, the upper front edge 35A of the unit 30A has struck the upstream edge 44 of the track cover 40, causing the unit 30A to become chipped and probably defective. It will be appreciated that both the situations shown in FIG. 2 and in FIG. 3 are highly undesirable, because they may lead to interruptions in production and/or defective units and resulting defective printed circuit boards.

FIGS. 4-6 illustrate an apparatus 100 that is adapted to prevent the problems illustrated in FIGS. 2 and 3. In FIGS. 4-6 the same reference numerals, except in 100 series, are used to denote the same or similar structures to those shown in FIGS. 1-3. However, the track cover 140 shown in FIGS. 4-6 is considerably modified with respect to track cover 40. A detector assembly 150 having a deflectable member 151 is installed at the upstream end of track cover 140. The deflectable member 151 is pivotally displaceable in directions 153 about pivot axis 154. Roller 156, which is rotatable about roller axis 155 is mounted in a head portion 152 of the deflectable member 151. A hole 160 is provided at a mid-portion of the deflectable member 151. A light beam 162 produced by a photodiode 164, or other light source, is directed onto a photo sensor 166 or other light detector, as best shown in FIG. 6. When deflectable number 151 is in it's normal "down" position shown in FIG. 4, light beam 162 passes through the hole 160 and is sensed by the photosensor 166. However when deflectable member is in its "up" position shown in FIG. 5, roller the hole 160 is also displaced upwardly such that the light beam 162 does not reach the photosensor 166. The light source and light detector thus act as a switch having one state associated with light being sensed when the deflectable member is in a "down position" and another state associated with no light being sensed when the deflectable member is in the up position. In another embodiment a mechanical switch is used instead of a light sensor type switch. Pivotal displacement of the deflectable member may be used to cause the switch to open.

Figure 7:
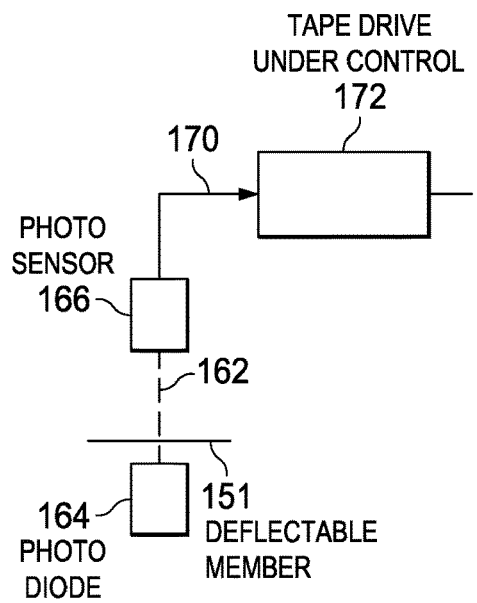
FIG. 7 is a schematic block diagram illustrating a control system for a carrier tape drive motor.

FIGS. 4-6 illustrate a situation in which there is a misplaced unit 130 in pocket 116. As the carrier tape 110 moves downstream 136, the unit 130 comes into contact with roller 156 in the head portion 152 of the deflectable member 151, causing the deflectable member 151 to rotate upwardly. This upward rotation of the deflectable member causes an interruption of the light beam 162. As best shown by FIG. 7, as a result of the interruption of the light beam 162, photo sensor 166 generates a signal 170 that is sent to a tape drive motor control circuit 172. In response to the signal 170 the control circuit 172 stops a carrier tape drive motor 174, FIG. 6, thereby stopping movement of the carrier tape 110. At this point an operator or appropriate robotics intervenes and either removes or properly reseats the unit 130 in the pocket 116. The deflectable member 151 may be appropriately counterbalanced such that even a very light force against the roller 156 will cause upward deflection of the deflectable member 151. Thus, a misplaced unit 130 that strikes the deflectable member 151 will not be damaged. In one embodiment the gap "g" between the top surface 112 of the carrier tape 110 and a bottom surface 143 of the track cover 140 is less than 0.1 mm. Such a small gap distance would not be feasible in an assembly such as shown in FIGS. 1-3 because of potential damage to misplaced unit 13. However, such a small gap distance is quite feasible in the assembly shown in FIGS. 4-6 because damage to a misplaced unit 130 is prevented by deflection of the deflectable member 151.

Figure 8:
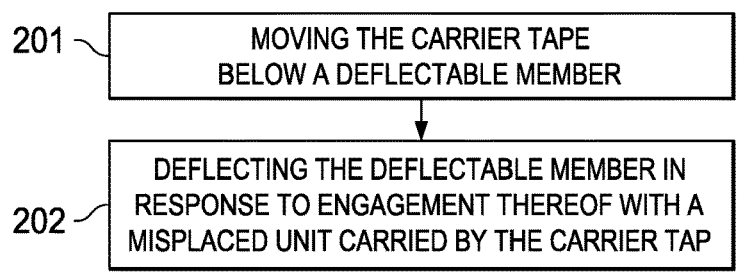
FIG. 8 is a flowchart of a method of detecting misplaced units carried by a carrier tape.

It will be appreciated from the above disclosure that a method of detecting misplaced units carried by a carrier tape may include, as shown by FIG. 8, block 201, moving the carrier tape below a deflectable member. The method may further include, as shown at block 202, deflecting the deflectable member in response to engagement thereof with a misplaced unit carried by the carrier tape.

Figure 9:
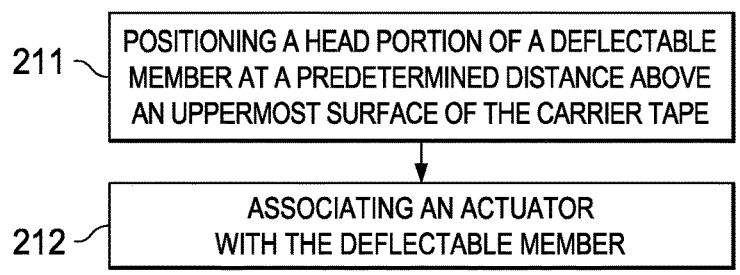
FIG. 9 is a flowchart of method of making an apparatus for detecting misplaced units in a moving carrier tape having a plurality of pockets with units positioned therein.

It will also be appreciated that a method of making an apparatus for detecting misplaced units in a moving carrier tape having a plurality of pockets with units positioned therein may include, as shown by FIG. 9 at block 211, positioning a head portion of a deflectable member at a predetermined distance above an uppermost surface of the carrier tape. The method may also include, as shown at block 212, associating an actuator with the deflectable member.

Although certain specific embodiments of an apparatus for detecting misplaced units in a moving carrier tape and associated methodology have been described in detail in this specification, the inventive concepts disclosed herein may be otherwise embodied, as will be obvious to persons skilled in the art after reading this disclosure. The claims appended hereto are not to be limited to the specific embodiments disclosed herein. Rather, they are to be broadly construed to cover alternative embodiments, except to the extent limited by the prior art.

What is claimed is:

1. An apparatus for attaching a cover tape from a track cover to a carrier tape having pockets for electronic components comprising:
   a detector assembly attached to the track cover, the detector assembly including:
      a deflectable member having a head portion;
      a roller attached to the head portion;
      a hole in the deflectable member, the deflectable member having a first position;
      a light source on a first side on the deflectable member; and
      a light detector on a second side of the deflectable member, the light detector aligned with the light source along a path, wherein the hole is aligned along the path between the light source and light detector when the deflectable member is in the first position and the hole is not aligned along the path between the light source and the light detector when the deflectable member is not in the first position.

2. The apparatus of claim 1 wherein, the hole is at a mid portion of the deflectable member.

3. The apparatus of claim 1 wherein, the light source is a photo diode and the light detector is a photo sensor.

4. The apparatus of claim 1 further comprising an actuator connected to the deflectable member.

5. The apparatus of claim 4, wherein the actuator is adapted to terminate displacement of the carrier tape in response to deflection of the deflectable member.

6. The apparatus of claim 1, wherein the first position is an undeflected position and the deflectable member further comprises a second, deflected position.

* * * * *